(12) United States Patent
Jung et al.

(10) Patent No.: US 10,978,637 B2
(45) Date of Patent: Apr. 13, 2021

(54) METHOD FOR FABRICATING ELECTRONIC DEVICE

(71) Applicant: SK hynix Inc., Icheon-Si (KR)

(72) Inventors: Ku-Youl Jung, Icheon-si (KR); Guk-Cheon Kim, Yeoju-si (KR); Jong-Koo Lim, Icheon-si (KR); Yang-Kon Kim, Icheon-si (KR); Jae-Hyoung Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 11 days.

(21) Appl. No.: 15/887,722

(22) Filed: Feb. 2, 2018

(65) Prior Publication Data
US 2018/0240973 A1 Aug. 23, 2018

(30) Foreign Application Priority Data

Feb. 21, 2017 (KR) .................. 10-2017-0022866

(51) Int. Cl.
| | |
|---|---|
| H01L 43/00 | (2006.01) |
| H01L 43/12 | (2006.01) |
| H01L 43/08 | (2006.01) |
| H01L 27/22 | (2006.01) |
| H01L 43/10 | (2006.01) |

(52) U.S. Cl.
CPC ............ *H01L 43/12* (2013.01); *H01L 27/222* (2013.01); *H01L 43/08* (2013.01); *H01L 43/10* (2013.01)

(58) Field of Classification Search
CPC ....... H01L 43/12; H01L 27/222; H01L 43/08; H01L 43/10
See application file for complete search history.

(56) References Cited

U.S. PATENT DOCUMENTS

| | | | | |
|---|---|---|---|---|
| 5,815,343 | A * | 9/1998 | Ishikawa | G11B 5/012 360/97.22 |
| 6,833,175 | B2 * | 12/2004 | Yoshida | G11B 5/7315 428/426 |
| 7,900,342 | B2 * | 3/2011 | Freitag | B82Y 10/00 216/62 |

FOREIGN PATENT DOCUMENTS

| | | |
|---|---|---|
| KR | 10-2004-0105187 | 12/2004 |
| KR | 10-2008-0106882 | 12/2008 |
| KR | 10-2015-0057159 | 5/2015 |

* cited by examiner

*Primary Examiner* — Mounir S Amer
*Assistant Examiner* — Alexander Belousov
(74) *Attorney, Agent, or Firm* — Perkins Coie LLP

(57) ABSTRACT

A method for fabricating an electronic device including a semiconductor memory may include forming a buffer layer over a substrate, the buffer layer operable to aide in crystal growth of an under layer; forming the under layer over the buffer layer, the under layer operable to aide in crystal growth of a free layer; and forming a Magnetic Tunnel Junction (MTJ) structure including the free layer having a variable magnetization direction, a pinned layer having a pinned magnetization direction, and a tunnel barrier layer interposed between the free layer and the pinned layer over the under layer.

18 Claims, 12 Drawing Sheets

METHOD FOR FABRICATING ELECTRONIC DEVICE

CROSS-REFERENCE TO RELATED APPLICATION

This patent document claims priority of Korean Patent Application No. 10-2017-0022866, entitled "METHOD FOR FABRICATING ELECTRONIC DEVICE" and filed on Feb. 21, 2017, which is incorporated herein by reference in its entirety.

TECHNICAL FIELD

This patent document relates to memory circuits or devices, methods for fabricating the same and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device and a method for fabricating the same, in which an electronic device includes a semiconductor memory which can improve characteristics of a variable resistance element.

In one aspect, a method for fabricating an electronic device including a semiconductor memory may include: forming a buffer layer over a substrate, the buffer layer operable to aide in crystal growth of an under layer; forming the under layer over the buffer layer, the under layer operable to aide in crystal growth of a free layer; and forming a Magnetic Tunnel Junction (MTJ) structure including the free layer having a variable magnetization direction, a pinned layer having a pinned magnetization direction, and a tunnel barrier layer interposed between the free layer and the pinned layer over the under layer, wherein the forming of the buffer layer may include: forming a first material layer over the substrate; performing an RF plasma treatment on the first material layer; and forming a second material layer over the first material layer.

Implementations of the above method may include one or more the following.

The performing the RF plasma treatment on the first material layer may include converting a portion of an upper part of the first material layer into an amorphous layer having surface defects. The method may further include performing a heat treatment after the forming of the second material layer so as to crystallize the first material layer, the amorphous layer and the second material layer. The first material layer and the second material layer may include a same material as each other, the material including one or more of a metal, a metal alloy, a metal nitride or a metal oxide. The method may further include forming one or more of a metal layer or a non-metal layer after the forming of the material layer for the second buffer layer. The forming of the under layer may include: forming a third material layer over the buffer layer; performing an RF plasma treatment on the third material layer; and forming a fourth material layer over the third material layer. The performing the RF plasma treatment on the third material layer may include converting a portion of an upper part of the third material layer into an amorphous layer having surface defects. The method may further include performing a heat treatment after the forming of the fourth material layer so as to crystallize the third material layer, the amorphous layer and the fourth material layer. The third material layer and the fourth material layer may include a same material as each other, the material including one or more of a metal, a metal alloy, a metal nitride or a metal oxide. The method may further include forming one or more of a metal layer or a non-metal layer after the forming of the fourth material layer.

In another aspect, a method for fabricating an electronic device including a semiconductor memory may include: forming a buffer layer over a substrate, the buffer layer operable to aide crystal growth of an under layer; forming the under layer over the buffer layer, the under layer operable to aide in crystal growth of a free layer; and forming a Magnetic Tunnel Junction (MTJ) structure including the free layer having a variable magnetization direction, a pinned layer having a pinned magnetization direction, and a tunnel barrier layer interposed between the free layer and the pinned layer over the under layer, wherein the forming of the under layer may include: forming a first material layer over the buffer layer; performing an RF plasma treatment on the first material layer; and forming a second material layer over the first material layer.

Implementations of the above method for fabricating the electronic device may include one or more the following.

The performing of the RF plasma treatment may include converting a portion of an upper part of the first material layer into an amorphous layer having surface defects. The first material layer and the second material layer may include a same material as each other, the material including one or more of a metal, a metal alloy, a metal nitride or a metal oxide. The method may further include forming one or more of a metal layer or a non-metal layer after the forming of the second material layer. The forming of the buffer layer may include: forming a third material layer over the substrate; performing an RF plasma treatment so as to convert a portion of an upper part of the third material layer into an amorphous layer having surface defects; and forming a fourth material layer over the amorphous layer, wherein the method further comprises, after the forming of the under layer, performing a heat treatment so as to crystallize the third material layer, the amorphous layer and the fourth material layer, and crystallize the first material layer, the amorphous layer and the second material layer. The third material layer and the fourth material layer may include a same material as each other, the material including one or more of a metal, a metal alloy, a metal nitride or a metal oxide.

These and other aspects, implementations and associated advantages are described in greater detail in the drawings, the description and the claims.

DETAILED DESCRIPTION

Figure 1:
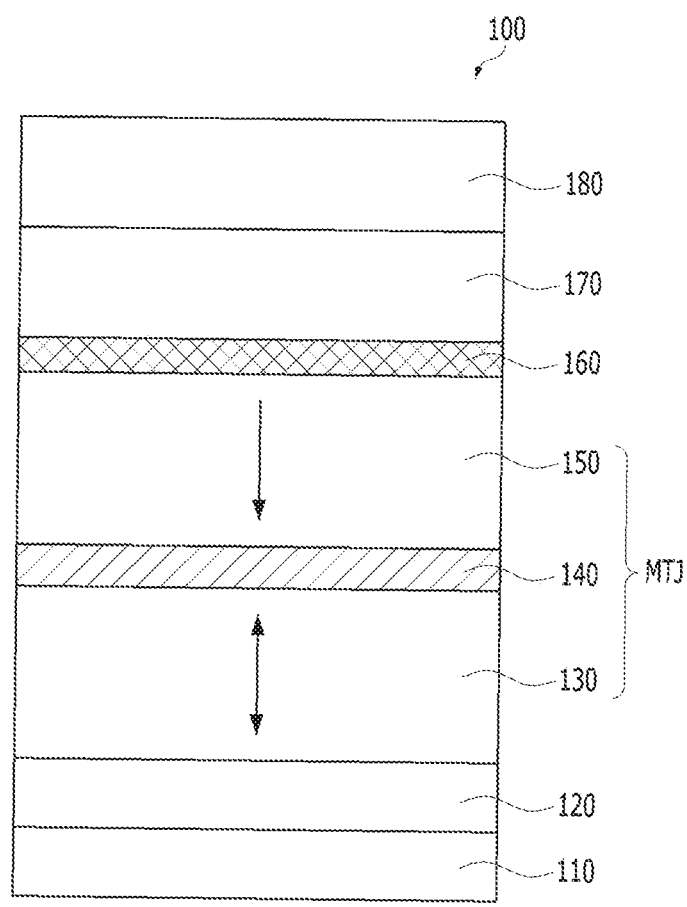
FIG. 1 is a cross-sectional view illustrating a variable resistance element in accordance with an implementation of the present disclosure.

Various examples and implementations of the disclosed technology are described below in detail with reference to the accompanying drawings.

The drawings may not be necessarily to scale and in some instances, proportions of at least some of substrates in the drawings may have been exaggerated in order to clearly illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer substrate may not reflect all layers present in that particular multilayer substrate (e.g., one or more additional layers may be present between two illustrated layers). As a specific example, when a first layer in a described or illustrated multi-layer substrate is referred to as being "on" or "over" a second layer or "on" or "over" a substrate, the first layer may be directly formed on the second layer or the substrate but may also represent a substrate where one or more other intermediate layers may exist between the first layer and the second layer or the substrate.

A variable resistance element may mean an element capable of being switched between different resistance states in response to an applied bias (for example, a current or voltage). The variable resistance element may store different data according to the resistance state. That is, the variable resistance element may function as a memory cell. The memory cell may further include a selecting element coupled to the variable resistance element and controlling an access to the variable resistance element. Such memory cells may be arranged in various way to form a semiconductor memory.

In some implementations, the variable resistance element may include an MTJ (Magnetic Tunnel Junction) structure which includes a free layer having a variable magnetization direction, a pinned layer having a fixed magnetization direction and a tunnel barrier layer interposed therebetween. In response to a voltage or current of a sufficient amplitude applied to the variable resistance element, the magnetization direction of the free layer may be changed to a direction parallel or antiparallel to the magnetization direction of the pinned layer. Thus, the variable resistance element may switch between a low-resistance state and a high-resistance state to thereby store different data based on the different resistance states. The disclosed technology and its implementations can be used to provide an improved variable resistance element capable of satisfying or enhancing various characteristics required for the variable resistance element.

FIG. 1 is a cross-sectional view illustrating an example of a variable resistance element in accordance with an implementation of the present disclosure.

Referring to FIG. 1, a variable resistance element 100 in accordance with the implementation of the disclosed technology may include an MTJ structure including a free layer 130 having a variable magnetization direction, a pinned layer 150 having a fixed magnetization direction, and a tunnel barrier layer 140 interposed between the free layer 130 and the pinned layer 150.

The free layer 130 may have a variable magnetization direction that causes the MTJ structure to have a variable resistance value. With the change of the magnetization direction of the free layer 130, the relative relationship of the magnetization directions of the free layer 130 and the pinned layer 150 also changes, which allows the variable resistance element 100 to store different data or represent different data bits. The free layer 130 may also be referred as a storage layer or the like. The magnetization direction of the free layer 130 may be substantially perpendicular to a surface of the free layer 130, the tunnel barrier layer 140 and the pinned layer 150. In other words, the magnetization direction of the free layer 130 may be substantially parallel to stacking directions of the free layer 130, the tunnel barrier layer 140 and the pinned layer 150. Therefore, the magnetization direction of the free layer 130 may be changed between a downward direction and an upward direction. The change in the magnetization direction of the free layer 130 may be induced by spin transfer torque.

The free layer 130 may have a single-layer or multilayer structure including a ferromagnetic material. For example, the free layer 130 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy or the like, or may include a stack of metals, such as Co/Pt, or Co/Pd or the like.

The tunnel barrier layer 140 may allow the tunneling of electrons in both data reading and data writing operations. In a write operation for storing new data, a high write current may be directed through the tunnel barrier layer 140 to change the magnetization direction of the free layer 130 and thus to change the resistance state of the MTJ for writing a new data bit. In a reading operation, a low reading current may be directed through the tunnel barrier layer 140 without changing the magnetization direction of the free layer 130 to measure the existing resistance state of the MTJ under the existing magnetization direction of the free layer 130 to read the stored data bit in the MTJ. It may include a dielectric oxide, for example, an oxide such as MgO, CaO, SrO, TiO, VO, or NbO or the like.

The pinned layer 150 may have a pinned magnetization direction which contrasts with the magnetization direction of the free layer 130, and may be referred to as a reference layer or the like. Although, in FIG. 1, the magnetization direction of the pinned layer 150 may be pinned in a downward direction, alternatively, unlike that shown in FIG. 1, the magnetization direction of the pinned layer 150 may be pinned in an upward direction. The pinned layer 150 may have a single-layer or multilayer structure including a ferromagnetic material. For example, the pinned layer 150 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy or the like, or may include a stack of metals, such as Co/Pt, or Co/Pd or the like.

If a voltage or current is applied to the variable resistance element 100, the magnetization direction of the free layer 130 may be changed by spin torque transfer. When the magnetization directions of the free layer 130 and the pinned layer 150 are parallel to each other, the variable resistance element 100 may be in a low resistance state to store a particular designated digital data bit such as '0'. Conversely, when the magnetization directions of the free layer 130 and the pinned layer 150 are anti-parallel to each other, the variable resistance element 100 may be in a high resistance state to store a different designated digital data bit such as '1'.

In some implementations, the variable resistance element 100 may further include one or more layers performing various functions to improve a characteristic of the MTJ structure.

For example, the variable resistance element 100 may further include a buffer layer 110, an under layer 120, a spacer layer 160, a magnetic correction layer 170 and a capping layer 180.

The buffer layer 110 may be disposed below the under layer 120 and aid in crystal growth of the under layer 120. When the buffer layer 110 is formed below the under layer 120, it is possible to aid in crystal growth of the under layer 120 and thus improve perpendicular magnetic crystalline anisotropy of the free layer 130. The buffer layer 110 may have a single-layer or multilayer structure including one or more of metal, a metal alloy, a metal nitride, or a metal oxide.

The under layer 120 may be disposed under the free layer 130 and serve to improve perpendicular magnetic crystalline anisotropy of the free layer 130. The under layer 120 may have a single-layer or multilayer structure including one or more of metal, a metal alloy, a metal nitride, or a metal oxide.

As such, the buffer layer 110 and the under layer 120 may have effects on crystal growth of the under layer 120 and the free layer 130, respectively. In order to form a crystalline structure in the buffer layer 110 and the under layer 120, a crystallization process may be performed by controlling deposition conditions of the layers or performing a heat treatment process. During the crystallization process, as a thickness of the layer is thicker and a temperature for the heat treatment is higher, crystal growth and magnetic characteristics can be improved. However, there are some limitations on the thickness of the layer. When thicknesses of the buffer layer 110 and the under layer 120 are thick, etch residues derived from materials included in the buffer layer 110 and the under layer 120 may be redeposited on sidewalls of the MTJ structure during etching the MTJ structure. Such etch residues increase the possibility of current leakage between the free layer 130 and the pinned layer 150, which are supposed to be electrically insulated from each other.

Some implementations of the disclose technology provide a variable resistance element with an improved crystallinity although the variable resistance element has the buffer layer 110 and/or the under layer 120 with thicknesses less than those in the conventional technology. In the implementation, the buffer layer 110 and/or the under layer 120 can have an improved crystallinity due to an amorphous layer having surface defects formed by an RF plasma treatment.

Thus, even though thicknesses of the layers are thin, crystal growth and magnetic characteristics can be improved. In some implementations, the thicknesses of the buffer layer 110 and/or the under layer 120 can be reduced by about 30% as compared with those in the conventional technology.

For example, the buffer layer 110 and/or the under layer 120 may be formed by depositing a material layer for the buffer layer 110 and/or the under layer 120, performing an RF plasma treatment to form an amorphous layer having surface defects, depositing again a material layer for the buffer layer 110 and/or the under layer 120 over the amorphous layer, and performing a heat treatment. During the heat treatment, crystal growth can be facilitated by the surface defects so that crystallization of the material layer can be intensified. Further, material diffusion from a structure disposed below the material layer can be prevented by the amorphous layer. Moreover, since surface etching is performed by the RF plasma treatment, a thickness of the buffer layer 110 and/or the under layer 120 can be decreased.

As a result, as compared to the case in which the buffer layer 110 and/or the under layer 120 is formed by simply depositing the material layer and performing a heat treatment, the present implementation in which the forming of the buffer layer 110 and/or the under layer 120 includes performing an RF plasma treatment to form an amorphous layer having surface defects makes it possible to improve crystallinity and magnetic characteristics, minimize deterioration of magnetic characteristics due to diffusion of material from structures disposed below the material layer, and reduce the number of a shunt failure due to the decrease of a thickness of the material layer.

The magnetic correction layer 170 may serve to offset the effect of the stray magnetic field produced by the pinned layer 150. In this case, the effect of the stray magnetic field of the pinned layer 150 can decrease, and thus a biased magnetic field in the free layer 130 can decrease. The magnetic correction layer 170 may have a magnetization direction anti-parallel to the magnetization direction of the pinned layer 150. In the implementation, when the pinned layer 150 has a downward magnetization direction, the magnetic correction layer 170 may have an upward magnetization direction. Conversely, when the pinned layer 150 has an upward magnetization direction, the magnetic correction layer 170 may have a downward magnetization direction. The magnetic correction layer 170 may have a single-layer or multilayer structure including a ferromagnetic material.

In this implementation, the magnetic correction layer 170 is located above the pinned layer 150, but the position thereof may be changed. For example, the magnetic correction layer 170 may also be located above, below, or next to the MTJ structure while it is patterned separately from the MTJ structure.

The spacer layer 160 may be interposed between the magnetic correction layer 170 and the pinned layer 150 and function as a buffer therebetween. Further, the spacer layer 160 may serve to improve characteristics of the magnetic correction layer 170. The spacer layer 160 may include a noble metal such as ruthenium (Ru).

The capping layer 180 may function as a hard mask for patterning the variable resistance element 100 and include various conductive materials such as a metal. In some implementations, the capping layer 180 may include a metallic material having a few pin holes and high resistance to wet and/or dry etching. For example, the capping layer 180 may include a noble metal such as ruthenium (Ru).

In the implementation, the free layer 130 is formed below the pinned layer 150. However, another implementation is also possible. For example, the free layer 130 may be formed above the pinned layer 150.

A method for forming the buffer layer 110 and/or the under layer 120 in accordance with the implementation will be exemplarily explained with reference to FIGS. 2A to 2D, FIGS. 3A to 3D and FIGS. 4A to 4G.

FIGS. 2A to 2D are cross-sectional views illustrating an example of a method for forming the buffer layer 110 in accordance with an implementation of the present disclosure.

Figure 2A:
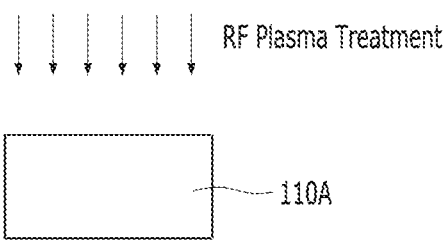
FIGS. 2A to 2D are cross-sectional views illustrating an example of a method for forming a buffer layer in accordance with an implementation of the present disclosure.

Referring to FIG. 2A, a material layer 110A for forming a first buffer layer may be formed over a substrate (not shown). The substrate may be a semiconductor substrate, and include predetermined structures formed therein. The material layer 110A for forming the first buffer layer may include one or more of a metal, a metal alloy, a metal nitride or a metal oxide.

Then, an RF plasma treatment process may be performed on the material layer 110A for forming the first buffer layer.

Figure 2B:
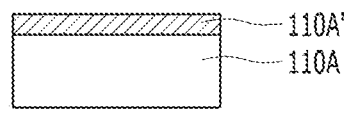

Referring to FIG. 2B, a portion of a surface of the material layer 110A may be etched by the RF plasma treatment and an amorphous layer 110A' having surface defects may be formed over the material layer 110A. The amorphous layer 110A' may have a thickness equal to or less than three monolayers.

Figure 2C:
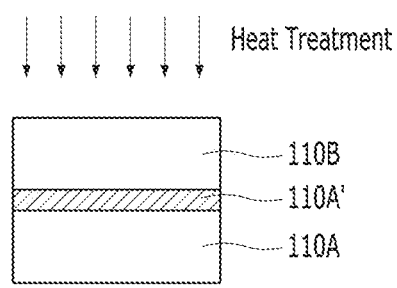

Referring to FIG. 2C, a material layer 110B for forming a second buffer layer may be formed over the amorphous layer 110A'. The material layer 110B for forming the second buffer layer may be formed of or include the same material as the material layer 110A for forming the first buffer layer.

Then, a heat treatment process may be performed. By the heat treatment, crystal growth can be facilitated through the surface defects. Crystallization may be started from the material layer 110B and transferred to a lower part as the heat treatment is progressed so that crystal growth can be intensified throughout the amorphous layer 110A' and the material layer 110A. As a result, all of the material layer 110A, the amorphous layer 110A' and the material layer 110B can be crystallized. Further, material diffusion which may occur during the heat treatment can be prevented by the amorphous layer 110A'.

Figure 2D:
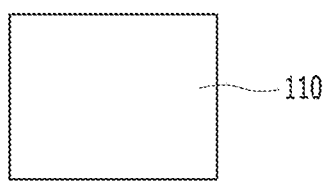

Referring to FIG. 2D, the buffer layer 110 may be formed as the result of the heat treatment which allows to achieve the crystal growth of the material layer 110A, the amorphous layer 110A' and the material layer 110B. The obtained buffer layer 110 can have a high crystallinity and material diffusion from lower structures can be prevented or minimized. Moreover, since surface etching is performed by the RF plasma treatment, the thickness can be reduced.

In the implementation, the heat treatment process is performed after forming the material layer 110B for the second buffer layer. However, other implementations are also possible. In another implementation, the heat treatment can be performed at a later time, for example, after further forming another metal or nonmetal layer over the material layer 110B for the second buffer layer.

FIGS. 3A to 3D are cross-sectional views illustrating an example of a method for forming the under layer 120 in accordance with an implementation of the present disclosure.

Figure 3A:
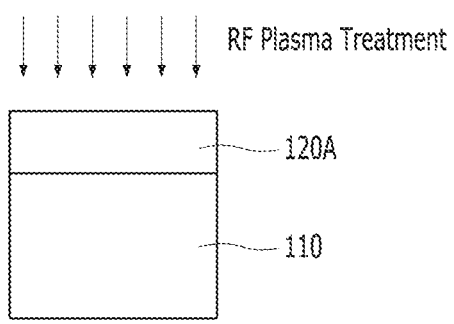
FIGS. 3A to 3D are cross-sectional views illustrating an example of a method for forming an under layer in accordance with an implementation of the present disclosure.

Referring to FIG. 3A, the buffer layer 110 may be formed over a substrate (not shown). The substrate may be a semiconductor substrate and include predetermined structures formed therein. The buffer layer 110 may include a single-layer or multilayer structure including one or more a metal, a metal alloy, a metal nitride or a metal oxide.

Then, a material layer 120A for forming a first under layer may be formed over the buffer layer 110. The material layer 120A for the first under layer may include one or more of a metal, a metal alloy, a metal nitride or a metal oxide.

Then, an RF plasma treatment process may be performed on the material layer 120A.

Figure 3B:
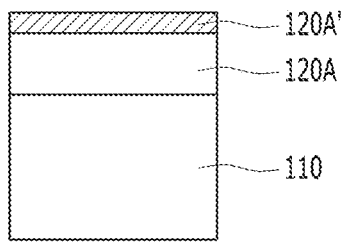

Referring to FIG. 3B, a portion of a surface of the material layer 120A may be etched by the RF plasma treatment, and an amorphous layer 120A' having surface defects may be formed over the material layer 120A. The amorphous layer 120A' may have a thickness equal to or less than three monolayers.

Figure 3C:
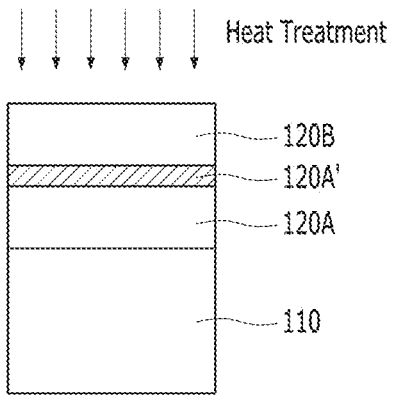

Referring to FIG. 3C, a material layer 120B for forming a second under layer may be formed over the amorphous layer 120A'. The material layer 120B for forming the second under layer may be formed of or include the same material as the material layer 120A for forming the first under layer.

Then, a heat treatment process may be performed. By the heat treatment, crystal growth can be facilitated through the surface defects. Crystallization may be started from the material layer 120B transferred to a lower part as the heat treatment is progressed so that crystal growth can be intensified throughout the amorphous layer 120A' and the material layer 120A.

As a result, all of the material layer 120A, the amorphous layer 120A' and the material layer 120B can be crystallized. Further, material diffusion which may occur during the heat treatment can be prevented by the amorphous layer 120A'.

Figure 3D:
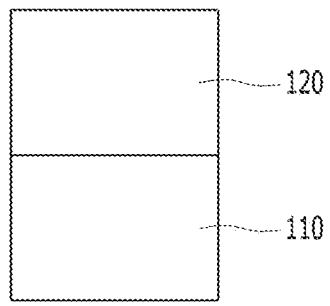

Referring to FIG. 3D, the under layer 120 in which crystal growth is achieved by the heat treatment may be formed. The obtained under layer 120 can have a high crystallinity and material diffusion from lower structures can be prevented or minimized. Moreover, since surface etching is performed by the RF plasma treatment, the thickness of the under layer 120 can be reduced.

Although, in the implementation, the heat treatment process is performed after forming the material layer 120B for the second under layer, the heat treatment may be performed at different timings. For example, the heat treatment can be performed after further forming another metal or nonmetal layer over the material layer 120B for the second under layer.

FIGS. 4A to 4G are cross-sectional views illustrating an example of a method for forming the buffer layer 110 and the under layer 120 in accordance with another implementation of the present disclosure.

Figure 4A:
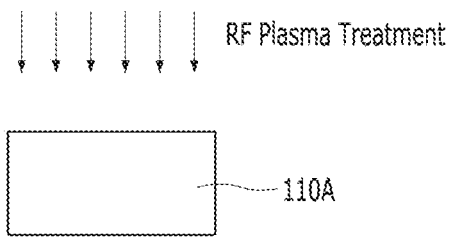
FIGS. 4A to 4G are cross-sectional views illustrating an example of a method for forming a buffer layer and an under layer in accordance with another implementation of the present disclosure.

Referring to FIG. 4A, a material layer 110A for a first buffer layer may be formed over a substrate (not shown). The substrate may be a semiconductor substrate, and include predetermined structures formed therein. The material layer 110A for the first buffer layer may include one or more of a metal, a metal alloy, a metal nitride or a metal oxide.

Then, an RF plasma treatment process may be performed on the material layer 110A.

Figure 4B:
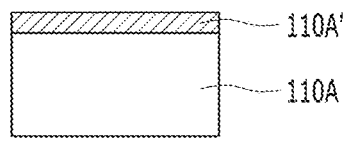

Referring to FIG. 4B, a portion of a surface of material layer 110A may be etched by the RF plasma treatment and an amorphous layer 110A' having surface defects may be formed over the material layer 110A. The amorphous layer 110A' may have a thickness equal to or less than three monolayers.

Figure 4C:
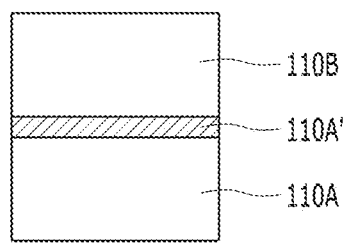

Referring to FIG. 4C, a material layer 110B for a second buffer layer may be formed over the amorphous layer 110A'. The material layer 110B for the second buffer layer may be formed of or include the same material as the material layer 110A for the first buffer layer.

Figure 4D:
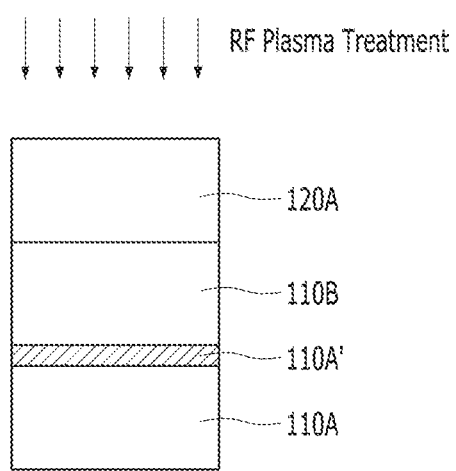

Referring to FIG. 4D, a material layer 120A for a first under layer may be formed over the material layer 110B. The material layer 120A for the first under layer may include one or more of a metal, a metal alloy, a metal nitride or a metal oxide.

Then, an RF plasma treatment process may be performed on the material layer 120A.

Figure 4E:
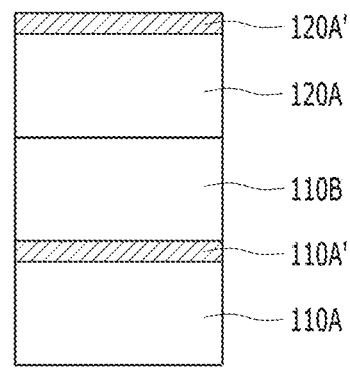

Referring to FIG. 4E, a portion of a surface of the material layer 120A may be etched by the RF plasma treatment and an amorphous layer 120A' having surface defects may be formed over the material layer 120A. The amorphous layer 120A' may have a thickness equal to or less than three monolayers.

Figure 4F:
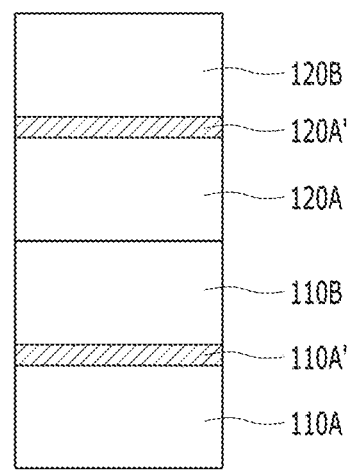

Referring to FIG. 4F, a material layer 120B for forming a second under layer may be formed over the amorphous layer 120A'. The material layer 120B for forming the second under layer may be formed of or include the same material as the material layer 120A for forming the first under layer.

Then, a heat treatment process may be performed. During the heat treatment, crystal growth can be facilitated through the surface defects formed on the amorphous layer 120A' and 110A'. Crystallization may be started from the layer disposed at an upper part of the stacked structure and transferred to a lower part of the stacked structure as the heat treatment is progressed. Accordingly, the crystal growth can be intensified throughout the layers across the upper part and lower part of the stacked structure. As a result, all of the material layer 110A, the amorphous layer 110A', the material layer 110B, the material layer 120A, amorphous layer 120A' and the material layer 120B can be crystallized. Further, material diffusion which may occur during the heat treatment can be prevented by the amorphous layer 110A' and amorphous layer 120A'.

Figure 4G:
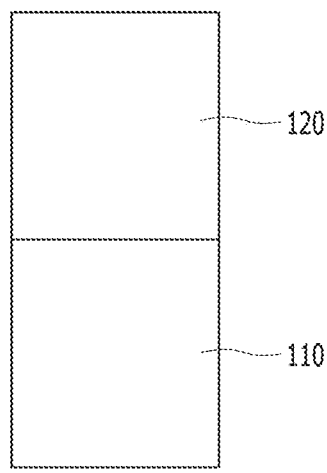

Referring to FIG. 4G, the buffer layer 110 and the under layer 120 that have improved crystal growth by the heat treatment may be formed. The obtained buffer layer 110 and the under layer 120 can have a high crystallinity and material diffusion from lower structures can be prevented or minimized. Moreover, since surface etching is performed by the RF plasma treatment, the thicknesses of the buffer layer 110 and the under layer 120 can be reduced.

Although, in the implementation, the heat treatment process is performed once after forming the material layer 120B, in another implementation, the heat treatment process may be performed twice after forming the material layer 110B and after forming the material layer 120B. The buffer layer 110 may be formed through the processes shown in FIGS. 2A to 2D, and then the under layer 120 may be formed over the buffer layer 110 through the processes shown in FIGS. 3A to 3D.

Although, in the implementation, the heat treatment is performed after forming the material layer 120B, in another implementation, the heat treatment may be performed after further forming another metal or nonmetal layer over the material layer 120B.

Advantages obtained by performing the RF plasma treatment during forming the buffer layer 110 and/or the under layer 120 in accordance with the implementation will be explained in detail with reference to FIG. 5.

Figure 5:
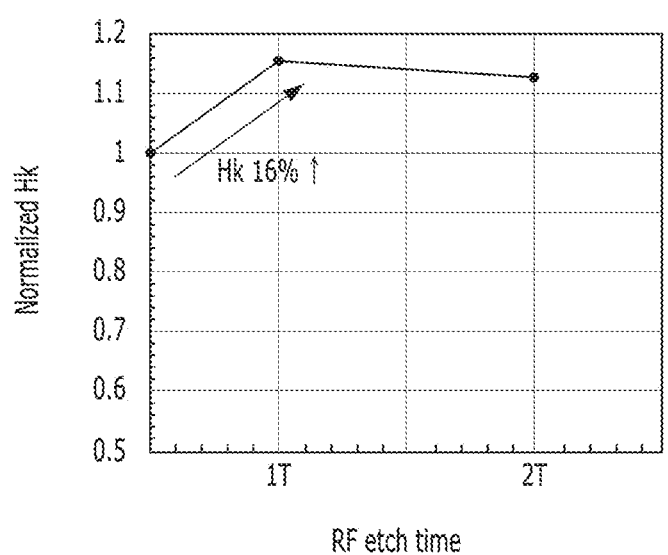
FIG. 5 is a graph illustrating perpendicular magnetic anisotropy of a variable resistance element in accordance with an implementation of the present disclosure.

FIG. 5 is a graph illustrating perpendicular magnetic anisotropy of a variable resistance element in accordance with an implementation of the present disclosure. A horizontal axis represents RF plasm etching time, and a vertical axis represents normalized perpendicular magnetic anisotropy field (Hk).

Referring to FIG. 5, as the RF etching process begins, the normalized Hk increases. During the RF etching process, the Hk has a value higher than the original value obtained when the RF etching process is not performed. It is confirmed that perpendicular magnetic anisotropy of the free layer 130 was increased by up to about 16% by performing the RF plasma treatment on the buffer layer 110 and/or the under layer 120 and there is no deterioration of the Hk value between 1T and 2T. This is because crystallinity of the buffer layer 110 and/or the under layer 120 is improved and material diffusion is prevented or minimized, thereby minimizing deterioration of magnetic characteristics.

Moreover, thermal stability of the free layer 130 can be increased due to the improvement of perpendicular magnetic anisotropy of the free layer 130. For reference, thermal stability may be expressed by the equation (1):

$$\Delta = \frac{Ms * t * S * Hk}{2k_B T} \quad \text{[Equation 1]}$$

wherein, S indicates an area of the free layer, kB indicates Boltzmann constant and T indicates a temperature.

With reference to equation (1), since the thermal stability is proportional to the Hk value of the free layer, if the Hk value is increased, the thermal stability is also increased.

As such, in accordance with the variable resistance element 100, the RF plasma treatment is performed during forming the buffer layer 110 and/or the under layer 120 so as to form the amorphous layer having surface defects. Due to the amorphous layer, it is possible to form the buffer layer 110 and/or the under layer 120 which has a smaller thickness and higher crystallinity. Also, material diffusion from parts disposed below the buffer layer 110 and/or the under layer 120 can be prevented. Therefore, the free layer 130 can have high perpendicular magnetic anisotropy and thermal stability. Moreover, deterioration of magnetic characteristic due to material diffusion can be minimized. As a result, it is possible to improve data storing characteristics and operation characteristics of the variable resistance element 100.

A semiconductor memory device based on the variable resistance element 100 as disclosed in this document may include a cell array of such variable resistance element 100 to store data. The cell array may include various components such as lines, elements, etc. to drive or control each variable resistance element 100. This will be exemplarily explained with reference to FIGS. 6A and 6B.

Figure 6A:
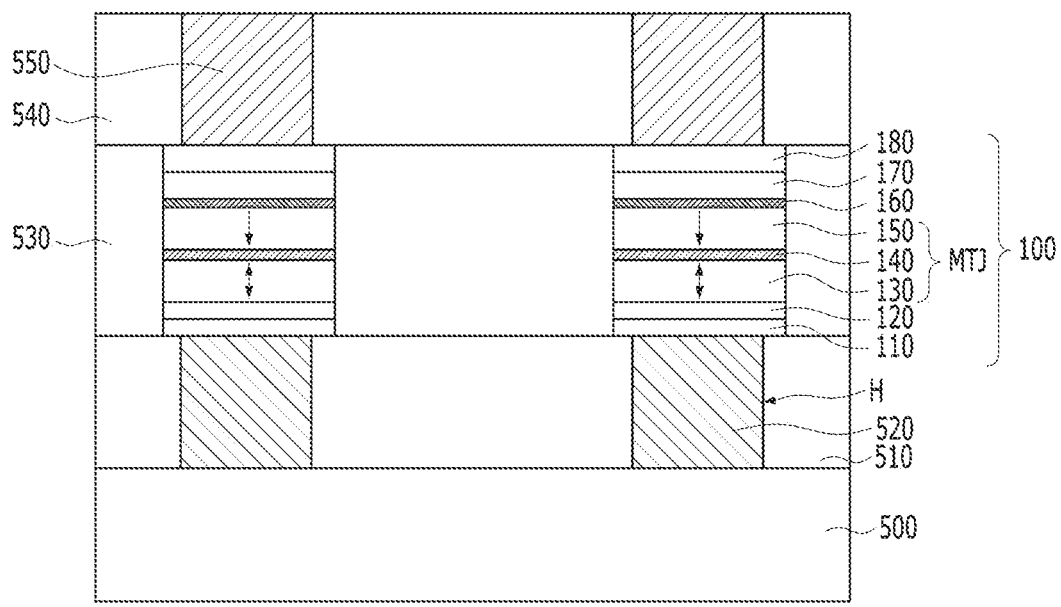
FIG. 6A is a cross-sectional view for explaining a memory device and a method for fabricating the same in accordance with an implementation of the present disclosure.

FIG. 6A is a cross-sectional view for explaining a memory device and a method for fabricating the same in accordance with an implementation of the present disclosure.

Referring to FIG. 6A, the memory device of this implementation may include may include a substrate 500, lower contacts 520 formed over the substrate 500, variable resistance elements 100 formed over the lower contacts 520 and upper contacts 550 formed over the variable resistance element 100. For each variable resistance element 100, a specific structure as a switch or switching circuit/element, for example, a transistor, for controlling an access to a particular variable resistance element 100 can be provided over the substrate 500 to control the variable resistance element 100, where the switch can be turned on to select the variable resistance element 100 or turned off to de-select the variable resistance element 100. The lower contacts 520 may be disposed over the substrate 500, and couple a lower end of the variable resistance element 100 to a portion of the substrate 500, for example, a drain of the transistor as the switching circuit for the variable resistance element 100. The upper contact 550 may be disposed over the variable resistance element 100, and couple an upper end of the variable resistance element 100 to a certain line (not shown), for example, a bit line. In FIG. 6A, two variable resistance elements 100 are shown as examples of the elements in an array of variable resistance elements 100.

The above memory device may be fabricated by following processes.

First, the substrate 500 in which the transistor or the like is formed may be provided, and then, a first interlayer dielectric layer 510 may be formed over the substrate 500. Then, the lower contact 520 may be formed by selectively etching the first interlayer dielectric layer 510 to form a hole H exposing a portion of the substrate 500 and filling the hole H with a conductive material. Then, the variable resistance element 100 may be formed by forming material layers for the variable resistance element 100 over the first interlayer dielectric layer 510 and the lower contact 520, and selectively etching the material layers. The etching process for forming the variable resistance element 100 may include the IBE method which has a strong physical etching characteristic. Then, a second interlayer dielectric layer 530 may be formed by filling spaces between the variable resistance elements 100 with an insulating material. Then, a third interlayer dielectric layer 540 may be formed over the variable resistance element 100 and the second interlayer dielectric layer 530, and then upper contacts 550 passing through the third interlayer dielectric layer 540 and coupled to an upper end of the variable resistance element 100 may be formed.

In the memory device in accordance with this implementation, all layers forming the variable resistance element 100 may have sidewalls which are aligned with one another. That is because the variable resistance element 100 is formed through an etching process using one mask.

Unlike the implementation of FIG. 6A, a part of the variable resistance element 100 may be patterned separately from other parts. This process is illustrated in FIG. 6B.

Figure 6B:
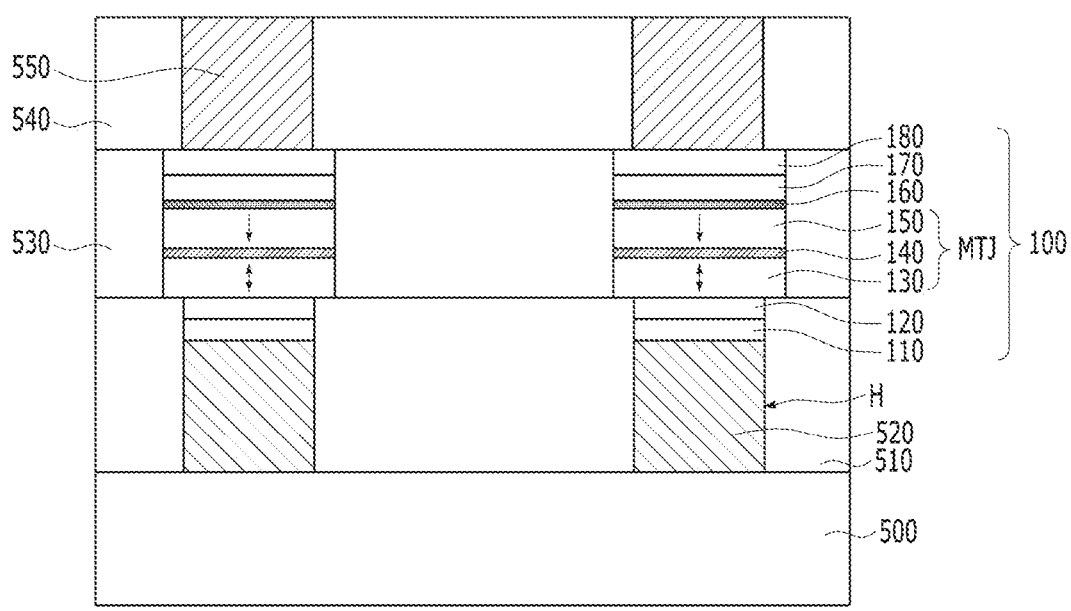
FIG. 6B is a cross-sectional view for explaining a memory device and a method for fabricating the same in accordance with another implementation of the present disclosure.

FIG. 6B is a cross-sectional view for explaining a memory device and a method for fabricating the same in accordance with another implementation of the present disclosure. The following descriptions will be focused on a difference from the implementation of FIG. 6A.

Referring to FIG. 6B, the memory device in accordance with this implementation may include a variable resistance element 100 of which parts, for example, a buffer layer 110 and a under layer 120 have sidewalls that are not aligned with the other layers thereof. As shown in FIG. 6B, the buffer layer 110 and the under layer 120 may have sidewalls which are aligned with lower contacts 520.

The memory device in FIG. 6B may be fabricated by following processes.

First, a first interlayer dielectric layer 510 may be formed over a substrate 500, and then selectively etched to form a hole H exposing a portion of the substrate 500. The, the lower contacts 520 may be formed to fill a lower portion of the hole H. For example, the lower contacts 520 may be formed through a series of processes of forming a conductive material to cover the resultant structure having the hole formed therein, and removing a part of the conductive material through an etch back process or the like until the conductive material has a desired thickness. Then, the buffer layer 110 and an under layer 120 may be formed so as to fill the remaining portion the hole H. For example, the buffer layer 110 may be formed by forming a material layer for the buffer layer 110 which covers the resultant structure in which the lower contacts 520 is formed, and then removing a portion of the material layer by, for example, an etch-back process until the material layer has a desired thickness. Moreover, the under layer 120 may be formed by forming a material layer for the under layer 120 which covers the resultant structure in which the lower contacts 520 and the buffer layer 110 are formed, and then performing a planarization process such as a CMP (Chemical Mechanical Planarization) until a top surface of the first interlayer dielectric layer 510 is exposed. The method for forming the buffer layer 110 and/or the under layer 120 is substantially the same as those as shown in FIGS. 2A to 2D, 3A to 3D, and 4A to 4G. Then, the remaining parts of the variable resistance element 100 may be formed by forming material layers for remaining layers of the variable resistance element 100 except the buffer layer 110 and the under layer 120 over the lower contacts 520 and the first interlayer dielectric layer 510. Subsequent processes are substantially the same as those as shown in FIG. 6A.

In this implementation, the height which needs to be etched at a time in order to form the variable resistance element 100 can be reduced, which makes it possible to lower the difficulty level of the etching process.

Although in this implementation, the buffer layer 110 and the under layer 120 are buried in the hole H, other parts of the variable resistance element 100 may also be buried as needed.

The above and other memory circuits or semiconductor devices based on the disclosed technology can be used in a range of devices or systems. FIGS. 7 to 11 provide some examples of devices or systems that can implement the memory circuits disclosed herein.

Figure 7:
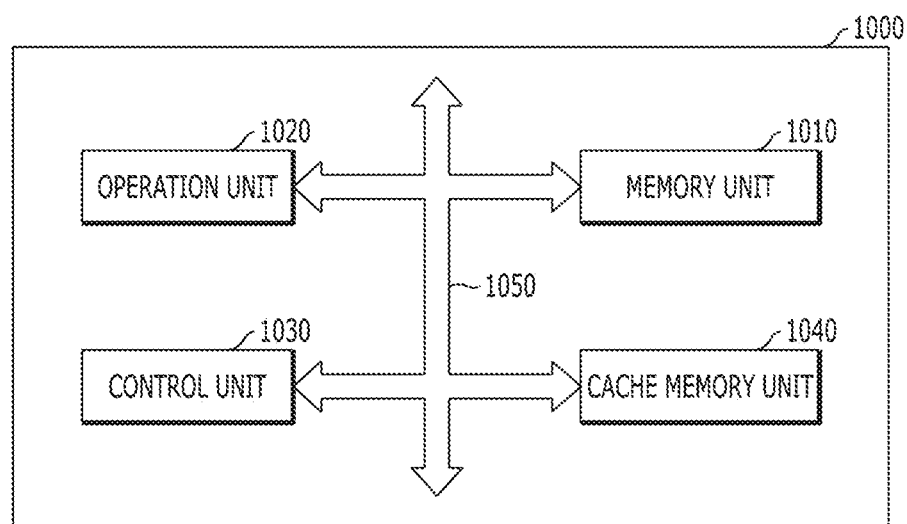
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices produced by a method for fabricating an electronic device including a semiconductor memory in accordance with the implementations. For example, the memory unit 1010 may be produced by a method including forming a buffer layer over a substrate, the buffer layer operable to aide in crystal growth of an under layer; forming the under layer over the buffer layer, the under layer operable to aide in crystal growth of a free layer; and forming a Magnetic Tunnel Junction (MTJ) structure including the free layer having a variable magnetization direction, a pinned layer having a pinned magnetization direction, and a tunnel barrier layer interposed between the free layer and the pinned layer over the under layer, wherein the forming of the buffer layer may include: forming a first material layer over the substrate; performing an RF plasma treatment on the first material layer; and forming a second material layer over the first material layer. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
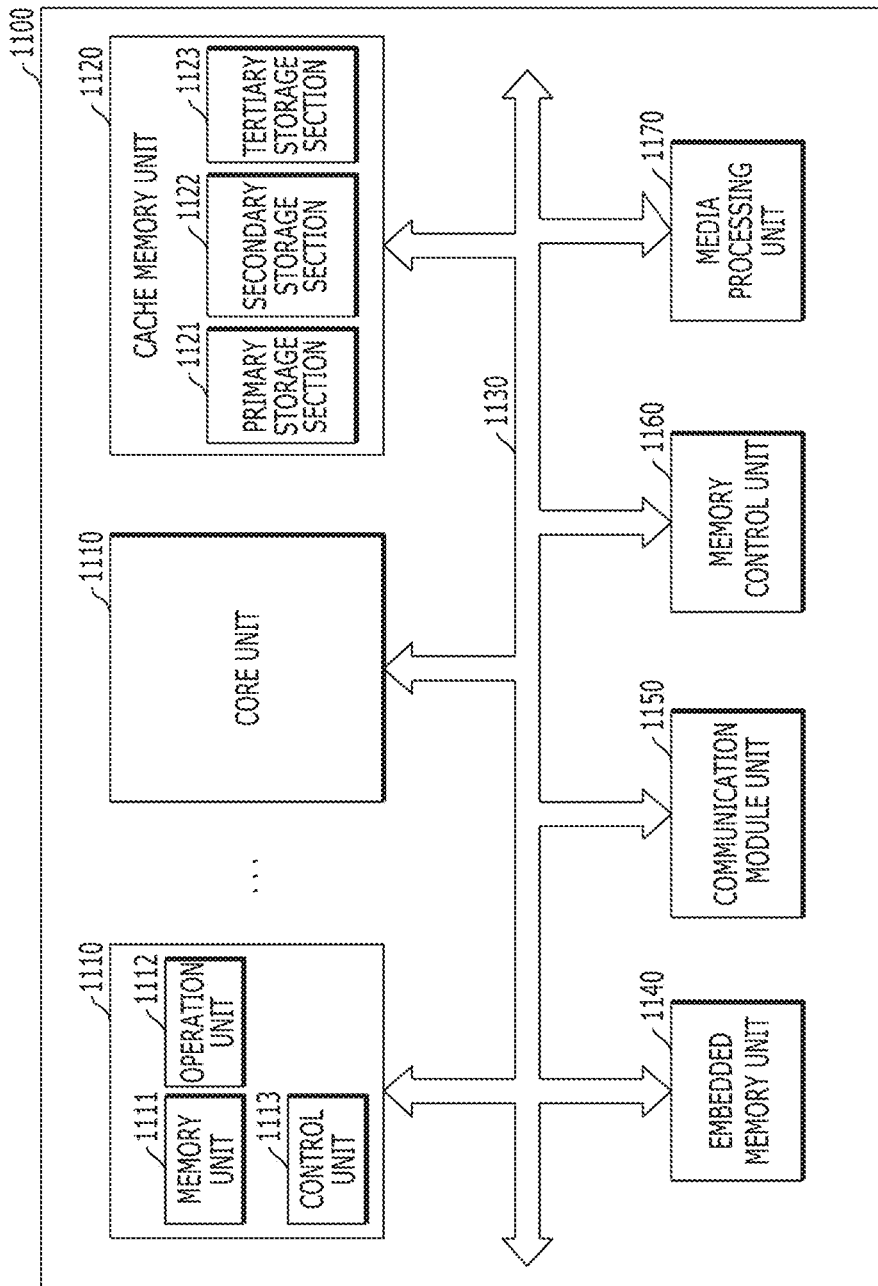
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices produced by a method for fabricating an electronic device including a semiconductor memory in accordance with the implementations. For example, the cache memory unit 1120 may be produced by a method including forming a buffer layer over a substrate, the buffer layer operable to aide in crystal growth of an under layer; forming the under layer over the buffer layer, the under layer operable to aide in crystal growth of a free layer; and forming a Magnetic Tunnel Junction (MTJ) structure including the free layer having a variable magnetization direction, a pinned layer having a pinned magnetization direction, and a tunnel barrier layer interposed between the free layer and the pinned layer over the under layer, wherein the forming of the buffer layer may include: forming a first material layer over the substrate; performing an RF plasma treatment on the first material layer; and forming a second material layer over the first material layer.

Through this, data storage characteristics of the cache memory unit 1120 may be improved. As a consequence, operating characteristics of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
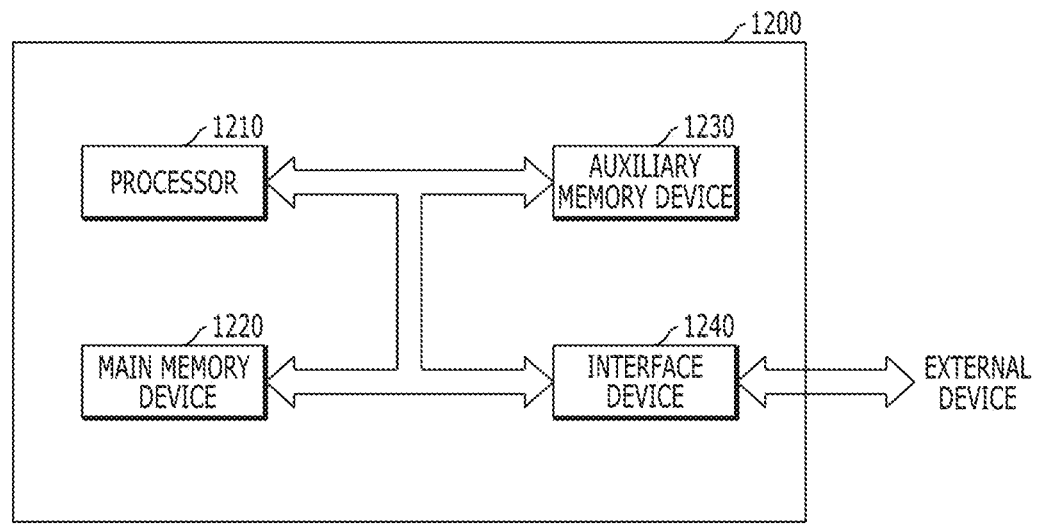
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices produced by a method for fabricating an electronic device including a semiconductor memory in accordance with the implementations. For example, the main memory device 1220 may be produced by a method including forming a buffer layer over a substrate, the buffer layer operable to aide in crystal growth of an under layer; forming the under layer over the buffer layer, the under layer operable to aide in crystal growth of a free layer; and forming a Magnetic Tunnel Junction (MTJ) structure including the free layer having a variable magnetization direction, a pinned layer having a pinned magnetization direction, and a tunnel barrier layer interposed between the free layer and the pinned layer over the under layer, wherein the forming of the buffer layer may include: forming a first material layer over the substrate; performing an RF plasma treatment on the first material layer; and forming a second material layer over the first material layer. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices produced by a method for fabricating an electronic device including a semiconductor memory in accordance with the implementations. For example, the auxiliary memory device 1230 may be produced by a method including forming a buffer layer over a substrate, the buffer layer operable to aide in crystal growth of an under layer; forming the under layer over the buffer layer, the under layer operable to aide in crystal growth of a free layer; and forming a Magnetic Tunnel Junction (MTJ) structure including the free layer having a variable magnetization direction, a pinned layer having a pinned magnetization direction, and a tunnel barrier layer interposed between the free layer and the pinned layer over the under layer, wherein the forming of the buffer layer may include: forming a first material layer over the substrate; performing an RF plasma treatment on the first material layer; and forming a second material layer over the first material layer. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MIVIC (eMMIC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
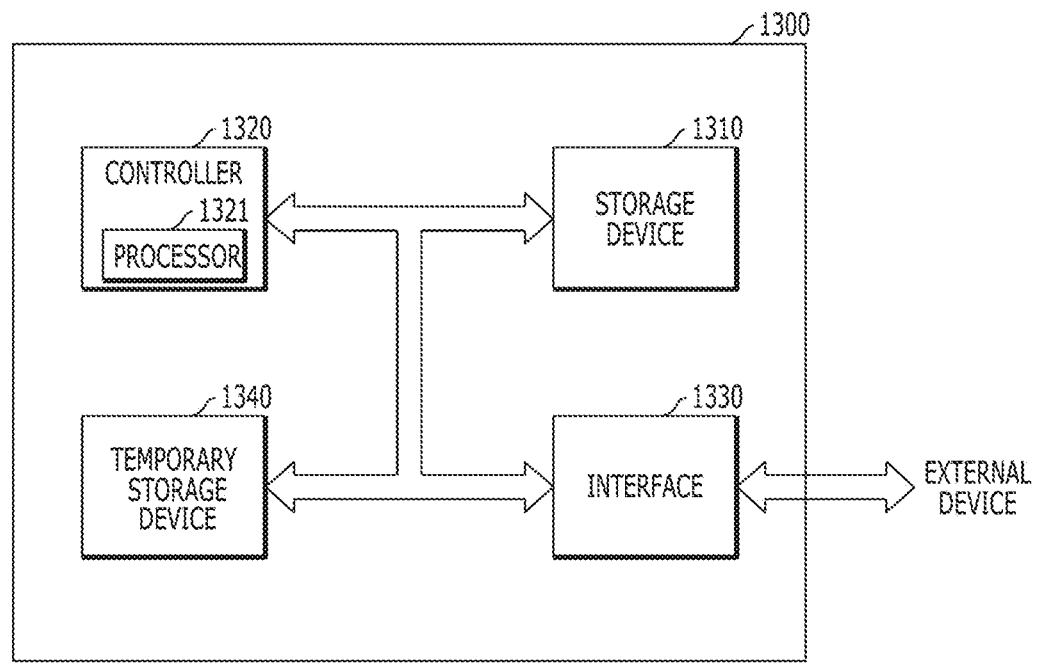
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices produced by a method for fabricating an electronic device including a semiconductor memory in accordance with the implementations. The temporary storage device 1340 may be produced by a method including forming a buffer layer over a substrate, the buffer layer operable to aide in crystal growth of an under layer; forming the under layer over the buffer layer, the under layer operable to aide in crystal growth of a free layer; and forming a Magnetic Tunnel Junction (MTJ) structure including the free layer having a variable magnetization direction, a pinned layer having a pinned magnetization direction, and a tunnel barrier layer interposed between the free layer and the pinned layer over the under layer, wherein the forming of the buffer layer may include: forming a first material layer over the substrate; performing an RF plasma treatment on the first material layer; and forming a second material layer over the first material layer. Through this, data storage characteristics of the storage device 1310 or the temporary storage device 1340 may be improved. As a consequence, operating characteristics and data storage characteristics of the data storage system 1300 may be improved.

Figure 11:
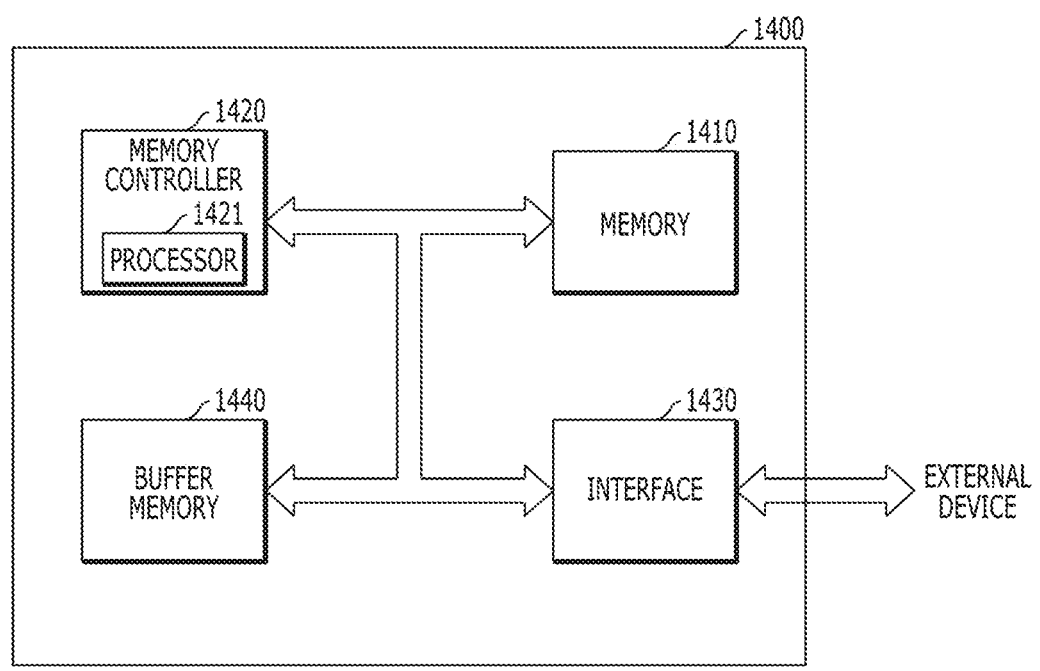
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices produced by a method for fabricating an electronic device including a semiconductor memory in accordance with the implementations. For example, the memory 1410 may be produced by a method including forming a buffer layer over a substrate, the buffer layer operable to aide in crystal growth of an under layer; forming the under layer over the buffer layer, the under layer operable to aide in crystal growth of a free layer; and forming a Magnetic Tunnel Junction (MTJ) structure including the free layer having a variable magnetization direction, a pinned layer having a pinned magnetization direction, and a tunnel barrier layer interposed between the free layer and the pinned layer over the under layer, wherein the forming of the buffer layer may include: forming a first material layer the substrate; performing an RF plasma treatment on the first material layer; and forming a second material layer over the first material layer. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices produced by a method for fabricating an electronic device including a semiconductor memory in accordance with the implementations. The buffer memory 1440 may be produced by a method including forming a buffer layer over a substrate, the buffer layer operable to aide in crystal growth of an under layer; forming the under layer over the buffer layer, the under layer operable to aide in crystal growth of a free layer; and forming a Magnetic Tunnel Junction (MTJ) structure including the free layer having a variable magnetization direction, a pinned layer having a pinned magnetization direction, and a tunnel barrier layer interposed between the free layer and the pinned layer over the under layer, wherein the forming of the buffer layer may include: forming a first material layer over the substrate; performing an RF plasma treatment on the first material layer; and forming a second material layer over the first material layer. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating an electronic device including a semiconductor memory, the method comprising:
   forming a buffer layer over a substrate, the buffer layer operable to aid in crystal growth of an under layer;
   forming the under layer over the buffer layer, the under layer operable to aid in crystal growth of a free layer; and
   forming a Magnetic Tunnel Junction (MTJ) structure including the free layer having a variable magnetization direction, a pinned layer having a pinned magnetization direction, and a tunnel barrier layer interposed between the free layer and the pinned layer over the under layer,
   wherein the forming of the buffer layer comprises:
   forming a first material layer over the substrate;
   performing an RF plasma treatment on the first material layer; and
   forming a second material layer over the first material layer,
   wherein the performing the RF plasma treatment on the first material layer includes converting a portion of an upper part of the first material layer into an amorphous layer having surface defects, and
   wherein the performing of the RF plasma treatment is performed before the forming of the second material layer.

2. The method of claim 1, further comprising performing a heat treatment after the forming of the second material layer so as to crystallize the first material layer, the amorphous layer and the second material layer.

3. The method of claim 1, wherein the first material layer and the second material layer include a same material as each other, the material including one or more of a metal, a metal alloy, a metal nitride or a metal oxide.

4. The method of claim 1, further comprising forming one or more of a metal layer or a non-metal layer after the forming of the second material layer.

5. The method of claim 1, wherein the forming of the under layer comprises:
   forming a third material layer over the buffer layer;
   performing an RF plasma treatment on the third material layer; and
   forming a fourth material layer over the third material layer for the first under layer.

6. The method of claim 5, wherein the performing the RF plasma treatment on the third material layer includes converting a portion of an upper part of the third material layer into an amorphous layer having surface defects.

7. The method of claim 5, wherein the third material layer and the fourth material layer include a same material as each other, the material including one or more of a metal, a metal alloy, a metal nitride or a metal oxide.

8. The method of claim 5, further comprising forming one or more of a metal layer or a non-metal layer after the forming of the fourth material layer.

9. A method for fabricating an electronic device including a semiconductor memory, the method comprising:
    forming a buffer layer over a substrate, the buffer layer operable to aid in crystal growth of an under layer;
    forming the under layer over the buffer layer, the under layer operable to aid in crystal growth of a free layer; and
    forming a Magnetic Tunnel Junction (MTJ) structure including the free layer having a variable magnetization direction, a pinned layer having a pinned magnetization direction, and a tunnel barrier layer interposed between the free layer and the pinned layer over the under layer,
    wherein the forming of the buffer layer comprises:
    forming a first material layer over the substrate;
    performing an RF plasma treatment on the first material layer; and
    forming a second material layer over the first material layer,
    wherein the performing the RF plasma treatment on the first material layer includes converting a portion of an upper part of the first material layer into an amorphous layer having surface defects,
    wherein the method further comprises performing a heat treatment after the forming of the second material layer so as to crystallize the first material layer, the amorphous layer and the second material layer, and
    wherein the forming of the under layer comprises:
    forming a third material layer over the buffer layer;
    performing an RF plasma treatment on the third material layer; and
    forming a fourth material layer over the third material layer for the first under layer.

10. The method of claim 9, wherein the performing the RF plasma treatment on the third material layer includes converting a portion of an upper part of the third material layer into an amorphous layer having surface defects.

11. The method of claim 10, further comprising performing a heat treatment after the forming of the fourth material layer so as to crystallize the third material layer, the amorphous layer and the fourth material layer.

12. The method of claim 9, wherein the third material layer and the fourth material layer include a same material as each other, the material including one or more of a metal, a metal alloy, a metal nitride or a metal oxide.

13. The method according to claim 9, further comprising forming one or more of a metal layer or a non-metal layer after the forming of the fourth material layer.

14. A method for fabricating an electronic device including a semiconductor memory, the method comprising:
    forming a buffer layer over a substrate, the buffer layer operable to aid in crystal growth of an under layer;
    forming the under layer over the buffer layer, the under layer operable to aid in crystal growth of a free layer; and
    forming a Magnetic Tunnel Junction (MTJ) structure including the free layer having a variable magnetization direction, a pinned layer having a pinned magnetization direction, and a tunnel barrier layer interposed between the free layer and the pinned layer over the under layer,
    wherein the forming of the under layer comprises:
    forming a first material layer over the buffer layer;
    performing an RF plasma treatment on the first material layer; and
    forming a second material layer over the first material layer,
    wherein the performing of the RF plasma treatment includes converting a portion of an upper part of the first material layer into an amorphous layer having surface defects, and
    wherein the performing of the RF plasma treatment is performed before the forming of the second material layer.

15. The method according to claim 14, wherein the first material layer and the second material layer include a same material as each other, the material including one or more of a metal, a metal alloy, a metal nitride or a metal oxide.

16. The method of claim 14, further comprising forming one or more of a metal layer or a non-metal layer after the forming of the second material layer.

17. The method of claim 14, wherein the forming of the buffer layer comprises:
    forming a third material layer over the substrate;
    performing an RF plasma treatment so as to convert a portion of an upper part of the third material layer into an amorphous layer having surface defects; and
    forming a fourth material layer over the amorphous layer,
    wherein the method further comprises, after the forming of the under layer,
    performing a heat treatment so as to crystallize the third material layer, the amorphous layer and the fourth material layer, and crystallize the first material layer, the amorphous layer and the second material layer.

18. The method of claim 17, wherein the third material layer and the fourth material layer include a same material as each other, the material including one or more of a metal, a metal alloy, a metal nitride or a metal oxide.

* * * * *